US010567984B2

(12) United States Patent
Kong et al.

(10) Patent No.: US 10,567,984 B2
(45) Date of Patent: Feb. 18, 2020

(54) SYSTEMS AND METHODS FOR TEST AND CALIBRATION OF MIMO ANTENNA ARRAYS INCLUDING A DIGITAL INTERFACE

(71) Applicant: Keysight Technologies, Inc., Minneapolis, MN (US)

(72) Inventors: Hong-Wei Kong, Beijing (CN); Yu Zuo, Beijing (CN); Zhu Wen, Beijing (CN); Ya Jing, Beijing (CN); Shao-Bo Chen, Fuzhou (CN)

(73) Assignee: Keysight Technologies, Inc., Santa Rosa, CA (US)

( * ) Notice: Subject to any disclaimer, the term of this patent is extended or adjusted under 35 U.S.C. 154(b) by 356 days.

(21) Appl. No.: 15/423,440

(22) Filed: Feb. 2, 2017

(65) Prior Publication Data

US 2017/0223559 A1 Aug. 3, 2017

(30) Foreign Application Priority Data

Feb. 2, 2016 (CN) .......................... 2016 1 0074228

(51) Int. Cl.
*H04W 24/06* (2009.01)
*H04B 7/0413* (2017.01)
*H04B 17/12* (2015.01)

(52) U.S. Cl.
CPC .......... *H04W 24/06* (2013.01); *H04B 7/0413* (2013.01); *H04B 17/12* (2015.01)

(58) Field of Classification Search
CPC ... H04W 24/06; H04B 17/0085; H04B 17/12; H04B 7/0413; H04B 7/0617; H04B 7/10;
(Continued)

(56) References Cited

U.S. PATENT DOCUMENTS 6,105,157 A 8/2000 Miller
7,349,447 B1 3/2008 Sung et al.
(Continued)

FOREIGN PATENT DOCUMENTS

WO 2016064376 A1 4/2016

OTHER PUBLICATIONS

Notice of Allowance dated Sep. 1, 2017 in co-pending U.S. Appl. No. 15/153,544, 7 pages.
(Continued)

*Primary Examiner* — Marsha D Banks Harold
*Assistant Examiner* — Dharmesh J Patel

(57) ABSTRACT

A testing system includes a test chamber including an array of spaced-apart probe antennas and a positioner configured to support a device under test (DUT) having an array of digital antenna elements, a radio frequency (RF) signal generator and analyzer configured to send and receive RF test signals to/from the spaced-apart probe antennas, and an RF switch component configured to selectively couple the RF signal generator and analyzer to the array of spaced-apart probe antennas within the test chamber. A digital test instrument includes at least one digital signal generator and analyzer configured to generate digital test signals to the digital antenna elements of the DUT in a transmitter test mode, and to analyze received digital test signals from the digital antenna elements of the DUT in a receiver test mode, a programmable hardware device configured to implement a custom digital fiber interface protocol for the generated and received digital test signals, and a digital fiber interface configured to couple the programmable hardware device to the array of digital antenna elements of the DUT and transceive the digital test signals to/from the array of digital antenna elements of the DUT. A synchronization module is configured to synchronize the RF signal generator and analyzer, and the digital test instrument. A test controller is configured to control operation of the positioner, the RF signal generator and analyzer, the RF switch component and the digital test instrument during testing of the DUT.

26 Claims, 4 Drawing Sheets

(58) Field of Classification Search
CPC .............. H04B 7/0404; H04B 17/102; G01R 29/0814; G01R 29/0878; G01R 29/105; G01R 31/2822; G01R 23/20; G01R 31/3025; G01R 31/265; H01Q 3/04; H04L 25/0212; H04L 25/0226
See application file for complete search history.

(56) References Cited

U.S. PATENT DOCUMENTS

| | | | |
|---|---|---|---|
| 8,312,329 | B1 | 11/2012 | Yellapantula et al. |
| 8,576,947 | B2 | 11/2013 | Olgaard et al. |
| 8,912,963 | B2 | 12/2014 | Mow et al. |
| 8,995,926 | B2 | 3/2015 | Mow et al. |
| 9,020,440 | B2* | 4/2015 | Kyösti |
| 9,107,098 | B2 | 8/2015 | Emmanuel et al. |
| 2004/0073860 | A1 | 4/2004 | Nishioka |
| 2007/0070691 | A1 | 3/2007 | Walvis et al. |
| 2007/0070881 | A1 | 3/2007 | Olgaard et al. |
| 2007/0268833 | A1 | 11/2007 | Dasilva |
| 2010/0007355 | A1 | 1/2010 | Olgaard et al. |
| 2011/0150050 | A1 | 6/2011 | Trigui et al. |
| 2012/0256639 | A1 | 10/2012 | Pausini et al. |
| 2012/0268153 | A1* | 10/2012 | Nickel et al. |
| 2013/0188509 | A1 | 7/2013 | Mellein et al. |
| 2013/0303089 | A1* | 11/2013 | Wang et al. |
| 2014/0160955 | A1 | 6/2014 | Lum et al. |
| 2014/0169177 | A1* | 6/2014 | Popescu et al. |
| 2014/0361798 | A1 | 12/2014 | Johnson et al. |
| 2014/0370821 | A1* | 12/2014 | Guterman et al. |
| 2016/0337052 | A1 | 11/2016 | Wen et al. |

OTHER PUBLICATIONS

Office Action dated Oct. 21, 2016 in co-pending U.S. Appl. No. 15/153,544.
Notice of Allowance dated Mar. 9, 2017 in co-pending U.S. Appl. No. 15/153,544.
International Search Report & Written Opinion dated Jan. 21, 2015 for International Application No. PCT/US14/61403.
GB Intent to Grant dated Oct. 1, 2018, 2 pgs.
Notice of Allowance dated Jun. 22, 2017 in co-pending U.S. Appl. No. 15/153,544, 7 pages.
Rowell et al., "Practical Large Scale Antenna Systems for 5G Cellular Networks", 2015 IEEE International Wireless Symposium, Mar. 30-Apr. 1, 2015.
Vieira et al., "A flexible 100-antenna testbed for Massive MIMO", Globecom Workshops (GC Wkshps), 2014.
Office Action dated Oct. 21, 2016 in UK Application No. GB1608255.4.
Notice of Allowance dated Dec. 18, 2017 in co-pending U.S. Appl. No. 15/153,544, 7 pages.
Notification of Grant dated Nov. 6, 2018, 2 pgs.

* cited by examiner

SYSTEMS AND METHODS FOR TEST AND CALIBRATION OF MIMO ANTENNA ARRAYS INCLUDING A DIGITAL INTERFACE

CROSS REFERENCE TO RELATED APPLICATIONS

The present application claims priority under 35 U.S.C. § 119(e) from Chinese Patent Application No. 201610074228.4 filed on Feb. 2, 2016 naming Hong-Wei Kong, et al. as inventors. The entire disclosure of Chinese Patent Application No. 201610074228.4 is specifically incorporated herein by reference.

BACKGROUND

In general, RF communication systems and devices, like other electronics, require testing and, in some cases, calibration. Testing and calibration can present challenges in the case of an RF communication system or device which supports multiple transmission (Tx) and reception (Rx) channels.

Some traditional approaches use a single-channel measurement instrument to test and calibrate each channel of a multi-channel RF communication device individually, one-by-one, in sequence. However, these approaches have some drawbacks. First, the repeated connection and disconnection of the single-channel measurement instrument to the multi-channel RF communication device under test (DUT) using RF connectors will influence the testing accuracy and repeatability. Second, as the number of transmission and/or reception channels increases, the time required to perform test and calibration also increases. In particular, in the case of massive multi-input, multi-output (MIMO) communication systems which are now being developed, the number of channels is very large (in many cases more than 64) and as a result testing each of these channels one-by-one is very time consuming and in fact as the number of channels increases, the time required can be prohibitive.

Some other approaches use multiple test instruments, or a multi-channel test instrument, to test channels in parallel. However, a disadvantage of this approach is that when the number of channels is very large, the test instruments, or multi-channel test instrument, becomes too expensive and even impractical.

Antenna array test and calibration approaches are widely used in both aerospace defense industry and also the wireless communication industry. Typical approaches mostly utilize a vector network analyzer and require the DUT to have RF connectors for the test. With the development of wireless communication technologies, the remote radio unit (RRU) and the baseband processing unit (BBU) are more often connected with a digital fiber interface, for example the Common Public Radio Interface (CPRI). CPRI is an example of an internal interface of a radio base station which links a radio equipment portion of the radio base station to a radio equipment control portion of the base station. CPRI is described in the CPRI Specification Version 5.0 or 6.0, for example. Other digital interfaces can also be used.

With such digital fiber interfaces, the prior antenna array test and calibration approaches are no longer applicable. New test and calibration methods for digital antenna arrays are needed. With the wireless communication technology moving toward the use of 5G, massive MIMO technology is going to be used. The digital massive MIMO antenna arrays bring the test and measurement challenges from not only the interface part, but also the overall test approach scalability, the test speed, the test calibration for broadband modulated signals etc.

Thus, the existing test approaches cannot provide a suitable test system and method that has a fast testing speed and low cost for future massive MIMO systems. It would be desirable to provide a more convenient (e.g. faster testing speed and lower cost) and more reliable method and system to test and calibrate the performance of a multi-channel RF communication system or device.

SUMMARY

The present embodiments may provide an ability to test and calibrate with support for a digital fiber interface and/or support for custom proprietary digital fiber interface protocols, an ability to test and calibrate both individual antenna elements and the beam fast, accurately and cost effectively, an ability to test and calibrate multi-beam at the same time, support test and calibration for broadband modulated signals, near-field test with a reduced chamber size and may be scalable in terms of cost and of number of channels and frequency coverage.

In accordance with a representative embodiment, a testing system includes a test chamber including an array of spaced-apart probe antennas and a positioner configured to support a device under test (DUT) having an array of digital antenna elements, a radio frequency (RF) signal generator and analyzer configured to send and receive RF test signals to/from the spaced-apart probe antennas, and an RF switch component configured to selectively couple the RF signal generator and analyzer to the array of spaced-apart probe antennas within the test chamber. A digital test instrument includes at least one digital signal generator and analyzer configured to generate digital test signals to the digital antenna elements of the DUT in a transmitter test mode, and to analyze received digital test signals from the digital antenna elements of the DUT in a receiver test mode, a programmable hardware device configured to implement a custom digital fiber interface protocol for the generated and received digital test signals, and a digital fiber interface configured to couple the programmable hardware device to the array of digital antenna elements of the DUT and transceive the digital test signals to/from the array of digital antenna elements of the DUT. A synchronization module is configured to synchronize the RF signal generator and analyzer, and the digital test instrument. A test controller is configured to control operation of the positioner, the RF signal generator and analyzer, the RF switch component and the digital test instrument during testing of the DUT.

In certain embodiments, interior surfaces of the test chamber are covered with radiation absorbent material (RAM) to define a RF anechoic test chamber having the array of spaced-apart probe antennas and the positioner therein.

In certain embodiments, the positioner is rotatable within the test chamber, and the test controller is configured to control rotation of the positioner during testing of the DUT.

In certain embodiments, the programmable hardware device comprises: a splitter/combiner coupled to the at least one digital signal generator and analyzer; a time delay module configured to implement a different time delay for the digital test signals being generated from the at least one digital signal generator and analyzer to each of the digital antenna elements of the DUT; and a protocol module to implement the custom digital fiber interface protocol for the generated digital test signals.

In certain embodiments, the RF signal generator and analyzer is configured to capture the digital test signals transmitted by the digital antenna elements of the DUT and received via the array of spaced-apart probe antennas and the RF switch component during the transmitter test mode.

In certain embodiments, the RF signal generator and analyzer is configured to send RF test signals via the array of spaced-apart probe antennas and the RF switch component to the digital antenna elements of the DUT during the receiver test mode to generate the received digital test signals to be analyzed by the at least one digital signal generator and analyzer of the digital test instrument.

In certain embodiments, the digital test instrument, RF signal generator and analyzer, and the test controller cooperate to measure a broadband channel impulse response for each digital antenna element of the DUT at different orientations to develop a 3D antenna pattern.

In certain embodiments, the digital test instrument, RF signal generator and analyzer, and the test controller further cooperate to derive calibration coefficients based upon the measured broadband channel impulse for each digital antenna element of the DUT at different orientations.

In certain embodiments, the digital test instrument, RF signal generator and analyzer, and the test controller cooperate to perform the transmitter test mode and the receiver test mode to obtain results for the broadband channel impulse response in near-field and further derive far-field results therefrom along with absolute phase information.

In certain embodiments, the programmable hardware device comprises: a splitter/combiner coupled to the at least one digital signal generator and analyzer; a calibration module configured to implement calibration coefficients for each of the digital antenna elements of the DUT in a beam test mode; a beam weight module configured to apply beam weights to each of the digital antenna elements of the DUT to steer a beam in a desired direction in the beam test mode; and a protocol module to implement the custom digital fiber interface protocol for the generated digital test signals.

In certain embodiments, the positioner is rotatable in an azimuth plane and an elevation plane within the test chamber, and the test controller is configured to control rotation of the positioner during the beam test mode.

In certain embodiments, the programmable hardware device further comprises a time delay module configured to implement a different time delay for respective beams in a multi-beam test mode.

In certain embodiments, the digital fiber interface of the digital test instrument is configured to operate using Common Public Radio Interface (CPRI) specification.

Another representative embodiment is directed to a method of testing a device under test (DUT) having an array of digital antenna elements. The method includes positioning the DUT on a positioner in a test chamber including an array of spaced-apart probe antennas, sending and receiving RF test signals to/from the spaced-apart probe antennas using a radio frequency (RF) signal generator and analyzer, selectively coupling the RF signal generator and analyzer to the array of spaced-apart probe antennas with an RF switch component, and measuring broadband channel impulse response for each digital antenna element of the DUT using a digital test instrument. The digital test instrument includes at least one digital signal generator and analyzer generating digital test signals to the digital antenna elements of the DUT in a transmitter test mode, and analyzing received digital test signals from the digital antenna elements of the DUT in a receiver test mode, a programmable hardware device implementing a custom digital fiber interface protocol for the generated and received digital test signals, and a digital fiber interface coupling the programmable hardware device to the array of digital antenna elements of the DUT and transceiving the digital test signals to/from the array of digital antenna elements of the DUT. The method further includes synchronizing the RF signal generator and analyzer, and the digital test instrument, using a synchronization module, and controlling operation of the positioner, the RF signal generator and analyzer, the RF switch component and the digital test instrument during testing of the DUT using a test controller.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
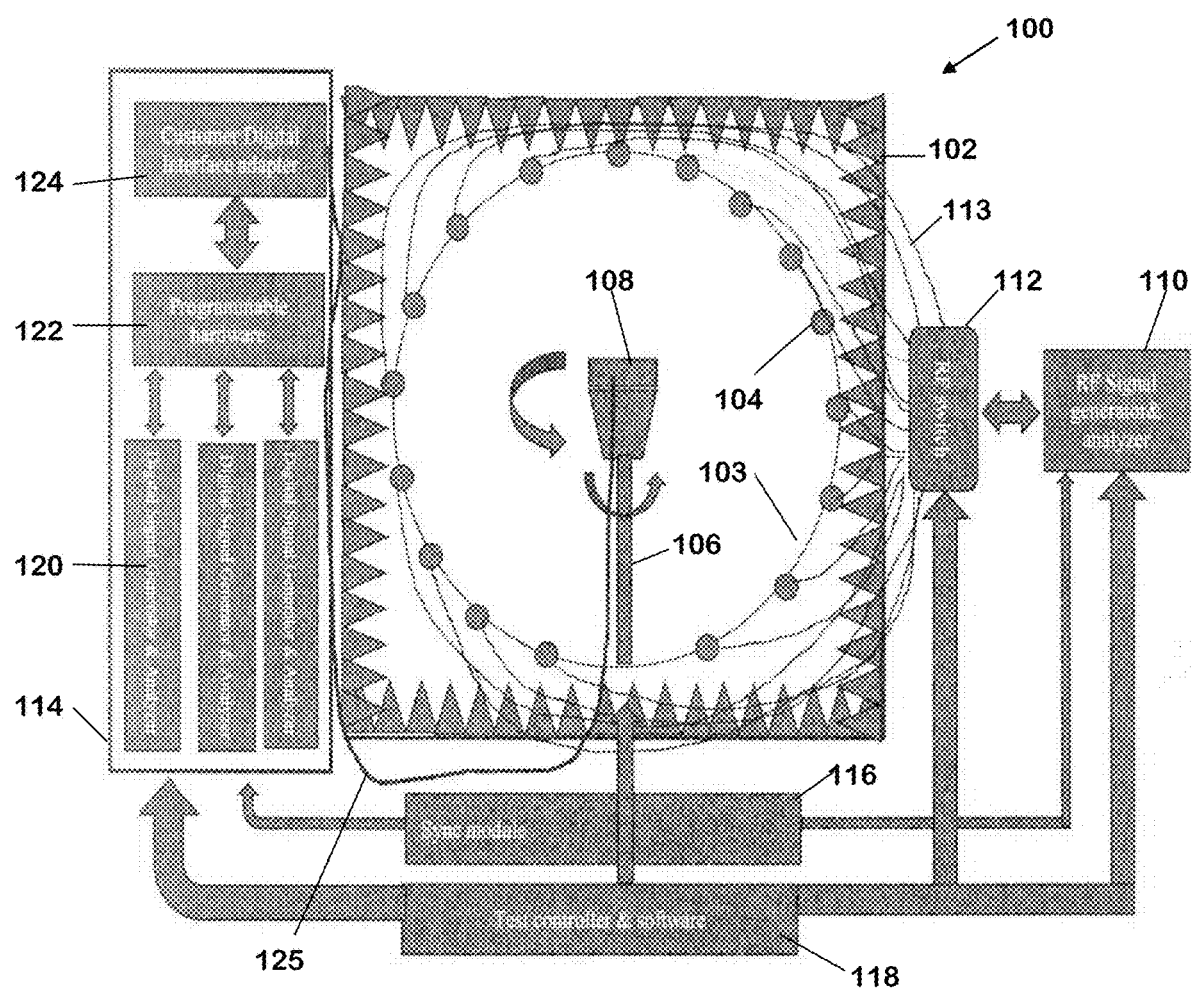
FIG. 1 is a schematic block diagram illustrating a test system in accordance with features of a representative embodiment.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

Relative terms may be used to describe the various elements' relationships to one another, as illustrated in the accompanying drawings. These relative terms are intended to encompass different orientations of the device and/or elements in addition to the orientation depicted in the drawings.

It will be understood that when an element is referred to as being "connected to" or "coupled to" another element, it can be directly connected or coupled, or intervening elements may be present.

'Computer memory' or 'memory' is an example of a computer-readable storage medium. Computer memory is any memory which is directly accessible to a processor. Examples of computer memory include, but are not limited to: RAM memory, registers, and register files. References to 'computer memory' or 'memory' should be interpreted as possibly being multiple memories. The memory may for instance be multiple memories within the same computer system. The memory may also be multiple memories distributed amongst multiple computer systems or computing devices.

A 'processor' as used herein encompasses an electronic component which is able to execute a program or machine executable instruction. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. Many programs have their instructions performed by multiple processors that may be within the same computing device or which may even be distributed across multiple computing devices.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

Initially, it is pointed out that many wireless communication technologies now include a digital fiber interface, for example the Common Public Radio Interface (CPRI). The digital massive MIMO antenna arrays bring the test and measurement challenges from not only the interface part, but also the overall test approach scalability, the test speed, the test calibration for broadband modulated signals etc. The embodiments described below may provide a more convenient (e.g. faster testing speed and lower cost) and more reliable method and system to test and calibrate the performance of a multi-channel RF communication system or device that includes a digital fiber interface.

Referring initially to FIG. 1, a representative embodiment of a test system 100 according to the present inventive features will be described. FIG. 1 is a schematic block diagram illustrating a test system 100 for testing and calibrating wireless communication devices, such as a base station, that include a digital fiber interface. In radio communications, a base station is a wireless communications station, e.g. installed at a fixed location, and used to communicate as part of a wireless telephone system such as cellular 5G. Digital massive MIMO includes use of a transmission point equipped with a very large number of antennas that simultaneously serve multiple users. With massive MIMO, multiple messages for several terminals can be transmitted on the same time-frequency resource, maximizing beamforming gain while minimizing interference, for example.

The Common Public Radio Interface (CPRI) standard defines the digital interface of base stations between the Radio Equipment Controllers (REC) in the standard, to local or remote radio units, referred to as Radio Equipment (RE). CPRI allows the use of a distributed architecture where base-stations, containing the REC, are connected to Remote Radio Heads (RRH or REs) via optical fiber links that carry the CPRI data. This architecture may reduce costs for service providers because only the remote radio heads need to be situated in environmentally challenging locations. The base-stations can be centrally located in less challenging locations where footprint, climate, and availability of power are more easily managed. In a typical network several Remote Radio Heads will be connected to the same base-station via CPRI links.

In FIG. 1, the test system 100 according to an embodiment includes a test chamber 102 including an array 103 of spaced-apart probe antennas 104 and a positioner 106 configured to support a device under test (DUT) 108 having an array of digital antenna elements (not shown). In certain embodiments, as would be appreciated by those skilled in the art, interior surfaces of the test chamber 102 are covered with radiation absorbent material (RAM) to define an RF anechoic test chamber having the array 103 of spaced-apart probe antennas 104 and the positioned 106 therein. The probe antennas 104 are preferably bi-polar antennas operating with vertical and/or horizontal polarization. The positioner 106 is rotatable within the test chamber 102 in one or more planes as will be described in further detail below.

A radio frequency (RF) signal generator and analyzer 110 is configured to send and receive RF test signals to/from the spaced-apart probe antennas 104, and an RF switch component 112 is configured to selectively couple the RF signal generator and analyzer 110 to the array 103 of spaced-apart probe antennas 104 within the test chamber 102. For example, the RF switch component 112 is connected to the array 103 of spaced-apart probe antennas 104 via RF cables 113. The RF switch component 112 in FIG. 1 includes multiple ports, and along with the RF signal generator and analyzer 110 may be provided by the present assignee Keysight Technologies, Inc.

The test system 100 includes a digital test instrument 114, synchronization module 116 and test controller 118. The digital test instrument 114, for example, may be a modular card with multiple high speed fiber optical interfaces, a large programmable or customizable integrated circuit (IC) such as a field programmable gate array (FPGA), and multiple high speed data links and associated memory for data storage etc. Alternatively, for example, the digital test instrument 114 may be a custom PC with multiple high speed fiber optical interfaces and specific software with functionality that can be changed according to the desired test etc.

The digital test instrument 114 includes one or more digital signal generator and analyzers 120 configured to generate digital test signals to the digital antenna elements of the DUT 108 in a transmitter test mode, and to analyze received digital test signals from the digital antenna elements of the DUT 108 in a receiver test mode. A programmable hardware device 122 is configured to implement a custom digital fiber interface protocol for the generated and received digital test signals, and a digital fiber interface 124 is configured to couple the programmable hardware device 122 to the array of digital antenna elements of the DUT 108 and transceive the digital test signals to/from the array of digital antenna elements of the DUT 108. As mentioned, the digital fiber interface 124 may couple the programmable hardware device 122 to the array of digital antenna elements of the DUT 108 with a digital fiber connection 125.

The synchronization module 116 is configured to synchronize the RF signal generator and analyzer 110 and the digital test instrument 114. For example, the synchronization module 116 may include a trigger signal generator and the clock signal which are used to synchronize the digital test instrument 114 and the RF signal generator and analyzer 110.

The test controller 118 is configured to control operation of the positioner 106, the RF signal generator and analyzer 110, the RF switch component 112 and the digital test instrument 114 during testing of the DUT 108 and may be coupled to such components via a communication bus and/or hardware interface. The test controller 118 maybe a computer, for example, including a CPU or processor with associated memory that runs test control software and also controls various peripherals which are used to control the positioner 106, the RF switch component 112, the RF signal generator and analyzer 110 and the digital test instrument 114 etc. A user interface for input of commands, and a display device for display of relevant information to the user, may also be associated with the test controller 118.

A 'user interface' as used herein is an interface which allows a user or operator to interact with a computer or computer system. A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer to indicate the effects of the operator's control or manipulation. The display of data or information on a display or a graphical user interface is an example of providing information to an operator. The receiving of data through a touch screen, keyboard, mouse, trackball, touchpad, pointing stick, graphics tablet, joystick, gamepad, webcam, headset, gear sticks, steering wheel, wired glove, wireless remote control, and accelerometer are all examples of user interface components which enable the receiving of information or data from an operator.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bistable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

The test system 100 calibration setup can be configured and customized differently depending on whether it is for individual antenna element test and calibration or for beam calibration. To support a customized digital fiber protocol, the programmable hardware device 122 can be loaded with different protocol implementations. For example, the programmable hardware device 122 is open for customization so that the user can load their own proprietary protocol in-house or via a vendor. With this approach, the user's proprietary protocol can be supported without compromising their design secret, and the test may be performed with the same approach.

Figure 2:
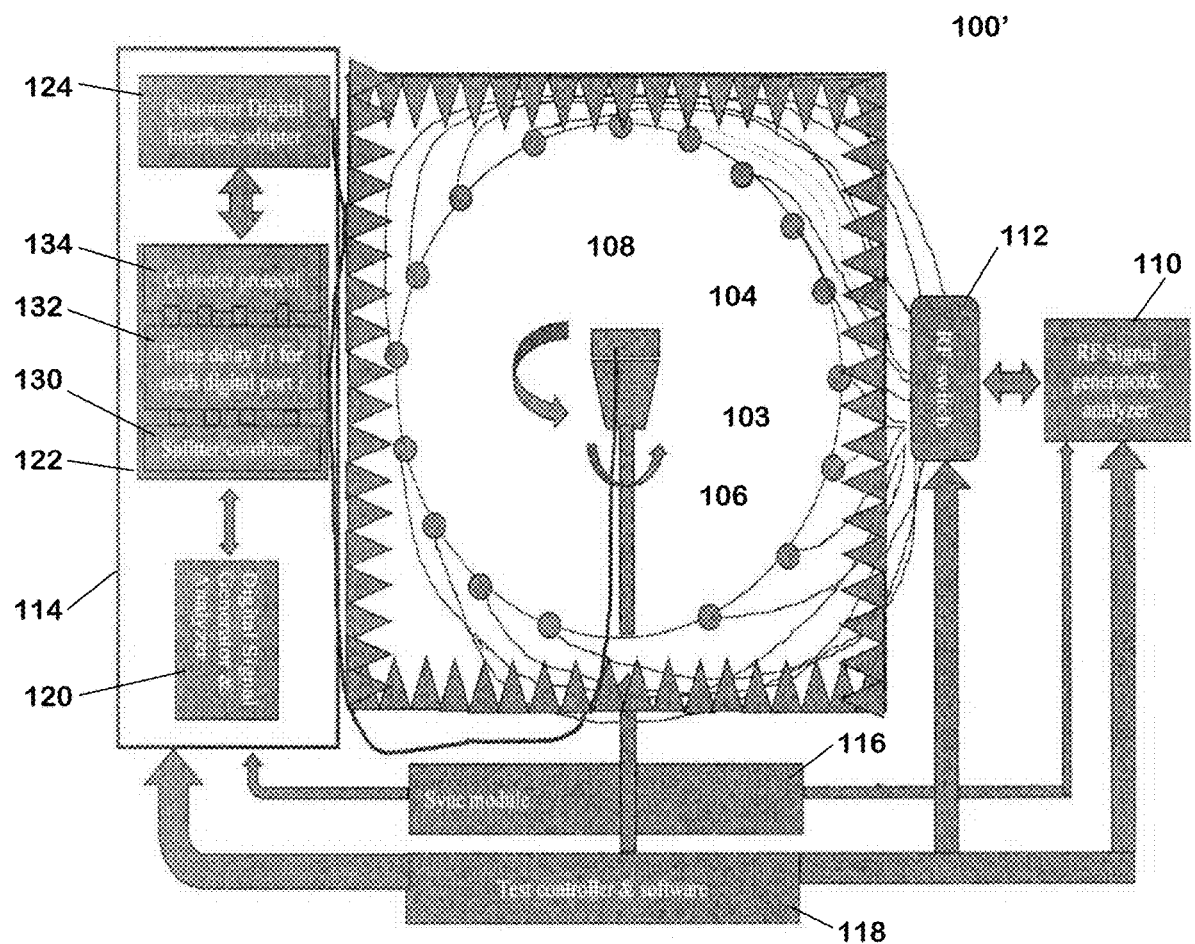
FIG. 2 is a schematic block diagram illustrating a test system in accordance with features of a representative embodiment.

The test configuration for the individual digital antenna elements of the DUT 108 is now described with additional reference to the test system 100' illustrated in FIG. 2. With this configuration, the broadband channel impulse for each antenna element and RF chain of the DUT 108 can be measured. By measuring the broadband channel impulse response for different orientations, the 3D antenna pattern for all the antenna elements can be measured. Using the measured broadband channel impulse response for each antenna element for different orientations, the corresponding calibration coefficients can be derived to beam the signal toward a given direction accurately.

The same test can be done for both the transmitter antenna elements and the receiver antenna elements. As illustrated in FIG. 2, for the transmitter antenna array test, there may just be a single digital signal generator and analyzer 120 to generate the digital signal which is processed and distributed to the antenna elements of the DUT 108 to stimulate the antenna elements, and the single channel RF signal generator and analyzer 110 is used to capture the RF signals from the different probe antennas 104 through the RF switch 112.

For the receiver antenna array test, the RF signal generator and analyzer 110 transmits the test waveform and radiates the waveform via the probe antennas 104 connected to the RF switch 110. The digital signals received from the different antenna elements of the DUT 108 will be processed and combined following the configurations in the programmable hardware 122 and then be received by the digital signal generator and analyzer 120 for further analysis. Through the analysis of the measured antenna element data, the calibration coefficients for each antenna branch can be derived, as would be appreciated by those skilled in the art.

As illustrated in FIG. 2, the programmable hardware device 122 of the digital test instrument 114 includes a splitter/combiner 130 to route signals to/from the one or more digital signal generator and analyzers 120. In certain embodiments, the programmable hardware device 122 further includes a time delay module 132 configured to implement a different time delay Ti for each digital port in the antenna element transmitter and receiver test modes. In other words, the time delay module 132 is configured to implement a different time delay for the digital test signals being generated from digital signal generator and analyzer 120 to each of the digital antenna elements of the DUT 108. A custom protocol module 134 interfaces the programmable hardware device 122 with the digital fiber interface 124.

So, the custom protocol module 134, as part of the programmable hardware device 122, implements the custom digital fiber interface protocol for the generated digital test signals. The custom protocol module 134 can allow the DUT tester to install their custom protocol into the digital test instrument 114 to perform the test without revealing the proprietary information to others and also helps make the test approach adaptable to different custom protocols from different DUT vendors and testers. With a test signal and the delays applied to the test signal sent to different antenna elements of the DUT 108, a single channel RF instrument, such as the RF signal generator and analyzer 110, can be used to do the single capture and measure all the antenna elements at once.

In certain embodiments, the RF signal generator and analyzer 110 is configured to capture the digital test signals transmitted by the digital antenna elements of the DUT 108 and received via the array 103 of spaced-apart probe antennas 104 and the RF switch component 112 during the transmitter test mode.

In certain embodiments, the RF signal generator and analyzer 110 is configured to send RF test signals via the array 103 of spaced-apart probe antennas 104 and the RF switch component 112 to the digital antenna elements of the DUT 108 during the receiver test mode to generate the received digital test signals to be analyzed by at least one digital signal generator and analyzer 120 of the digital test instrument 114.

Figure 3:
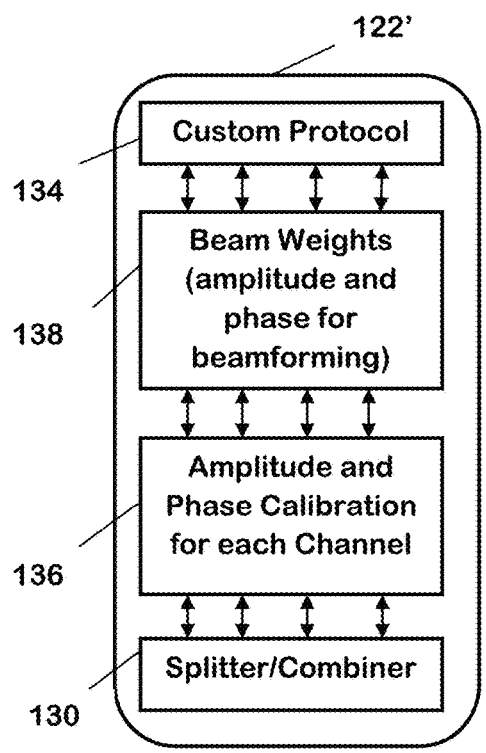
FIG. 3 is a is a schematic block diagram illustrating a digital test instrument of the test system in accordance with features of a representative embodiment.

The calibration coefficients can be future implemented in the programmable hardware 122 for each beam to do the beam test and calibration inside the chamber 102 again. The test configuration may be the same as FIG. 2 except that the programmable hardware 122' is configured differently. The configuration of the programmable hardware 122' is shown in FIG. 3.

In this embodiment, the programmable hardware device 122' includes a splitter/combiner 130 coupled to the digital signal generator and analyzer 120. A calibration module 136 is configured to implement calibration coefficients for each of the digital antenna elements of the DUT 108 in a beam test mode, and a beam weight module 138 is configured to apply beam weights to each of the digital antenna elements of the DUT 108 to steer a beam in a desired direction in the beam test mode. Again, a protocol module 134 implements the custom digital fiber interface protocol for the generated digital test signals.

So, the over-the-air (OTA) test is performed in near-field to reduce the requirements on the anechoic chamber 102 size. Based on the near-field test results, far-field results may be further derived. To derive the far-field results from the near-field results, the absolute phase information may be used. This is achieved with synchronization of the transmitter sides and the receiver side of the measurement systems. The near-field measurement can greatly reduce the requirements on the chamber size and then significantly reduce the overall test system cost. With accurate calibration and near-field to far-field conversion, the performance that can be achieved in near-field test setup are comparable to what can be achieved in a real field test of the DUT 108.

To speed the measurement, as discussed above, the anechoic chamber 102 uses an array 103 or ring of antenna probes 104 and an RF switch 112 to do the fast measurement to get the antenna data for one 2D cut. The DUT 108 on the positioned 106 is rotated in the azimuth plane. By using the probe array 103 and the positioned 106, 3D nearfield antenna measurement results can be determined relatively quickly. By using the test method disclosed in U.S. patent application Ser. No. 15/153,544 (which is herein incorporated by reference in it's entirety), the antenna measurement data for all the antenna elements can be measurement with a single data capture. The test system 100 can thus achieve fast 3D antenna measurement and calibration.

For the beam measurement calibration, the calibration coefficients will be implemented in the programmable hardware 122'. The beam weights will also be applied in the programmable hardware 122' to beam the signal toward a given direction. The beam then will be measured inside the chamber 102 again. To improve the measurement resolution, the positioner 106 will not only be rotated in the azimuth plane with very fine resolution around the target beam azimuth direction but also will be rotated in the elevation plane with very fine resolution. With this kind of measurement, the accurate 3D near-field measurement results for the beam pattern can be determined. Based on the 3D near-field measurement results, the 3D far field measurement results can be derived based on a near-field to far-field conversion. For the case when the main beam is of interest, it is possible to just capture the near-field data for the main beam with very fine resolution for both azimuth and elevation for the space containing the main beam data. This might significantly reduce the overall measurement time.

A similar approach can be used to do multi-beam measurement at the same time. To measure the beams at the same time, different delays are applied to the same data stream. Those delayed data streams are then used to form the delayed beams. By using the same test method disclosed in U.S. patent application Ser. No. 15/153,544, (which is herein incorporated by reference in it's entirety), the measurement results for different beams for the same position can be determined with a single capture, which speeds up the measurement significantly.

Figure 4:
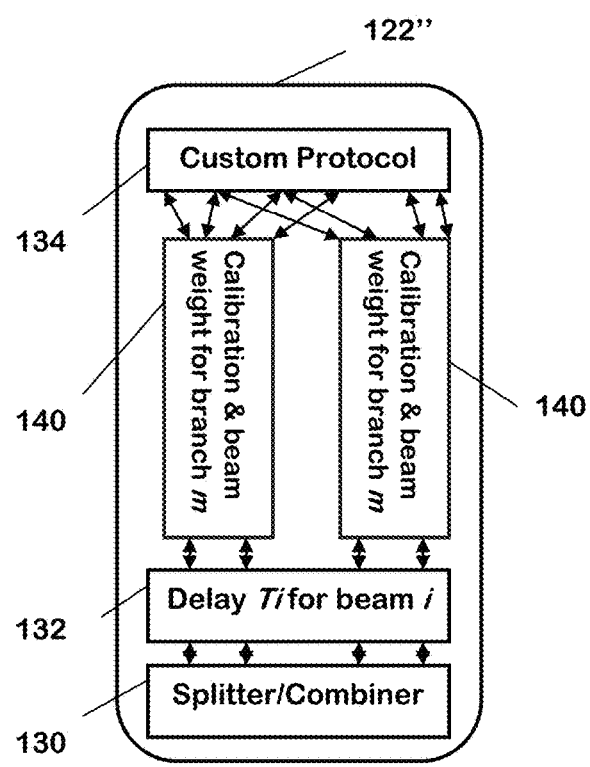
FIG. 4 is a is a schematic block diagram illustrating a digital test instrument of the test system in accordance with features of a representative embodiment.

The test configuration of the programmable hardware 122" for multiple beams test and calibration is the same as test configuration shown in FIG. 2 except the programmable hardware 122" is configured differently as shown in FIG. 4. Here, a splitter/combiner 130 routes signals to/from the one or more digital signal generator and analyzers 120, and a time delay module 132 is configured to implement a different time delay Ti for each digital port in antenna element transmitter and receiver test modes. The custom protocol module 134 interfaces the programmable hardware device 122 with the digital fiber interface 124.

The calibration and beam weights hardware functionality 140 for beam i is the same as the functionalities shown in FIG. 3 regarding the calibration module 136 and the beam weight module 138. For different beams, the beam weights and calibration coefficients will be different.

If 3D accurate far field measurement results are needed for all directions, by rotating the positioner 106 in the azimuth and elevation planes with very fine resolution and also using the multi-probe antennas 104, accurate 3D near-field test results can be acquired. If the main beam is of interest, based on the beam weights of each beam, directions of those beams on the azimuth plan can be roughly estimated. By controlling the positioner 106 and also using the probe antennas 104, the nearfield data for the main beam of each beam can be determined, which can significantly reduce the measurement time.

The multi-beam near-field measurement data is then converted to far field again. The beam direction and beam gain are compared with the expected beam direction and gain. The differences are used to derive the beam calibration coefficients and are further downloaded into the programmable hardware 122. The multi-beam test can be run again using the same configuration as shown in FIG. 4 but with updated calibration coefficients for each beam to check whether the calibration can achieve expected results.

The multi-beam test and calibration can be done for both transmitter mode and receiver mode. For the transmitter antenna array test, there may be a single digital signal generator and analyzer 120 and the RF signal generator and analyzer 112 in the test configuration, and for the receive antenna array test, there will be the digital signal generator and analyzer 120 and the RF signal generator and analyzer 112, which are exactly the same as the single beam test configuration.

In the test and calibration, a dedicated test signal is used. In a real system the real signals are used. There might be a need to validate the test and calibration results with the real signal. The multiple digital signal generator and analyzers 120 in FIG. 1 can also be used to validate the multi-beam beamforming results when real multi-beam signals are used after the test and calibration for the antenna array is finished. The programmable hardware 122 will use the configurations as shown in FIG. 4 and with the right calibration coefficients and also beam weights. The signal stream for each beam can be delayed or not delayed based on the test need. The RF signal generator and analyzer 112 can capture the signal for each beam to validate the beamforming results for each beam using the test process mentioned for the multi-beam test and calibration above. Similarly, the validation of the beamforming results for real signal for the receive antenna array can be applied. The multiple digital signal generator and analyzers 120 can be used to capture the multiple beam signals directly.

Figure 5:
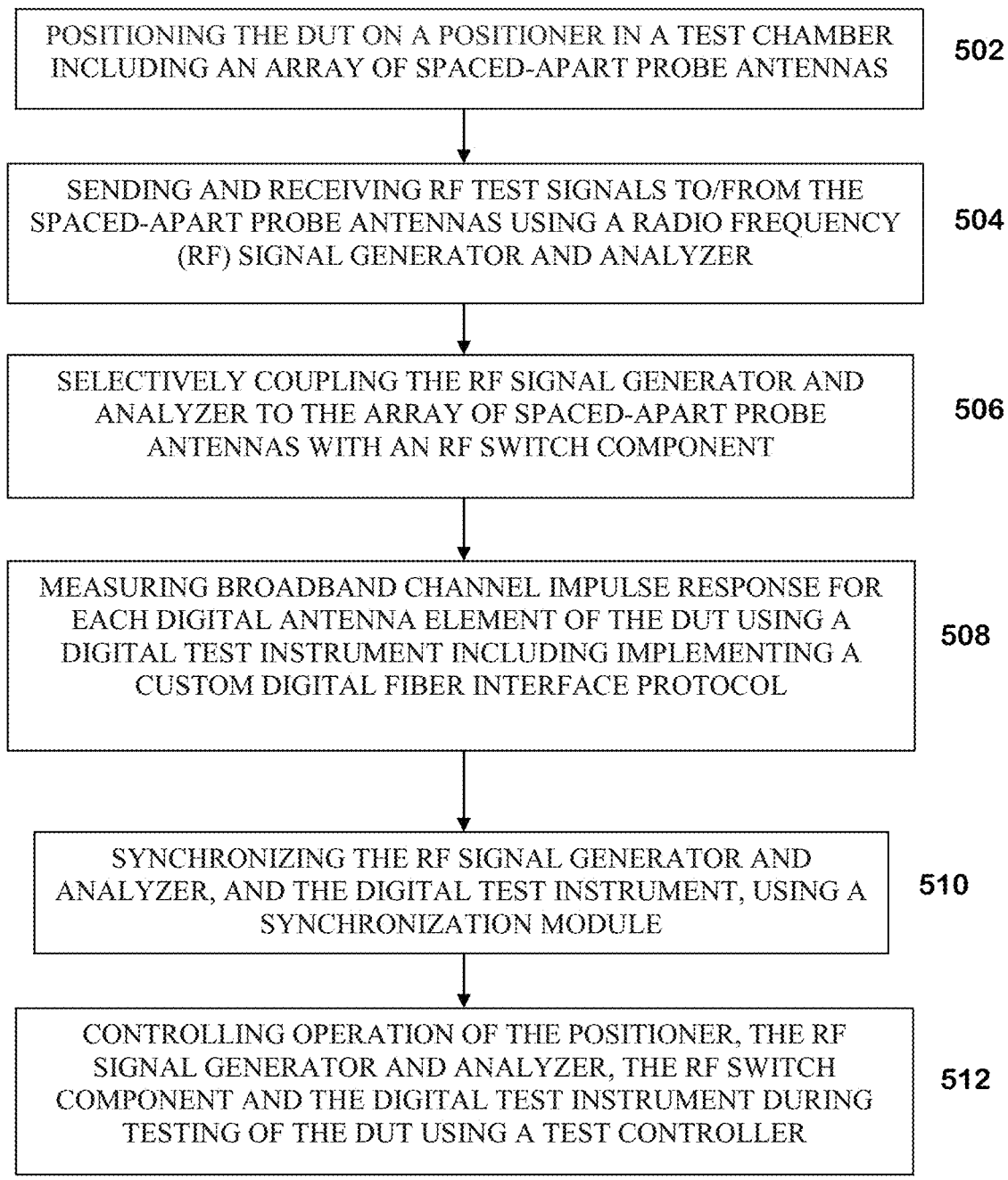
FIG. 5 is a flowchart illustrating various method steps in accordance with features of a representative embodiment.

FIG. 5 is a flowchart illustrating various method steps in accordance with features of a representative embodiment. The method 500 is for testing a device under test (DUT) 108 having an array of digital antenna elements. The method includes, at block 502, positioning the DUT 108 on a positioner 106 in a test chamber 102 including an array 103 of spaced-apart probe antennas 104. At block 504, the method includes sending and receiving RF test signals to/from the spaced-apart probe antennas 104 using a radio frequency (RF) signal generator and analyzer 110, then at block 506 selectively coupling the RF signal generator and analyzer 110 to the array 103 of spaced-apart probe antennas 104 with an RF switch component 112. The method further includes, at block 508, measuring broadband channel impulse response for each digital antenna element of the DUT 108 using a digital test instrument 114.

The digital test instrument 114 includes at least one digital signal generator and analyzer 120 generating digital test signals to the digital antenna elements of the DUT 108 in a transmitter test mode, and analyzing received digital test signals from the digital antenna elements of the DUT 108 in a receiver test mode. A programmable hardware device 122 implements a custom digital fiber interface protocol for the generated and received digital test signals, and a digital fiber interface 124 couples the programmable hardware device 122 to the array of digital antenna elements of the DUT 108 and transceives the digital test signals to/from the array of digital antenna elements of the DUT 108. The method further includes, at block 510, synchronizing the RF signal generator and analyzer 110, and the digital test instrument 114, using a synchronization module 116, and, at block 512, controlling operation of the positioner 106, the RF signal generator and analyzer 110, the RF switch component 112 and the digital test instrument 114 during testing of the DUT 108 using a test controller 118.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems, for example, as discussed above.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A testing system comprising:
    a test chamber including an array of spaced-apart probe antennas and a positioner configured to support a device under test (DUT) having an array of digital antenna elements;
    a radio frequency (RF) signal generator and analyzer configured to send and receive RF test signals to/from the spaced-apart probe antennas;
    an RF switch component configured to selectively couple the RF signal generator and analyzer to the array of spaced-apart probe antennas within the test chamber;
    a digital test instrument including
        at least one digital signal generator and analyzer configured to generate digital test signals to the digital antenna elements of the DUT in a transmitter test mode, and to analyze received digital test signals from the digital antenna elements of the DUT in a receiver test mode
        a programmable hardware device configured to implement a custom digital fiber interface protocol for the generated and received digital test signals, and
        a digital fiber interface configured to couple the programmable hardware device to the array of digital antenna elements of the DUT and transceive the digital test signals to/from the array of digital antenna elements of the DUT;
    a synchronization module configured to synchronize the RF signal generator and analyzer, and the digital test instrument; and
    a test controller configured to control operation of the positioner, the RF signal generator and analyzer, the RF switch component and the digital test instrument during testing of the DUT.

2. A testing system according to claim 1, wherein interior surfaces of the test chamber are covered with radiation absorbent material (RAM) to define a RF anechoic test chamber having the array of spaced-apart probe antennas and the positioner therein.

3. A testing system according to claim 1, wherein the positioner is rotatable within the test chamber; and wherein the test controller is configured to control rotation of the positioner during testing of the DUT.

4. A testing system according to claim 1, wherein the programmable hardware device comprises:
    a splitter/combiner coupled to the at least one digital signal generator and analyzer;
    a time delay module configured to implement a different time delay for the digital test signals being generated from the at least one digital signal generator and analyzer to each of the digital antenna elements of the DUT; and a protocol module to implement the custom digital fiber interface protocol for the generated digital test signals.

5. A testing system according to claim 1, wherein the RF signal generator and analyzer is configured to capture the digital test signals transmitted by the digital antenna elements of the DUT and received via the array of spaced-apart probe antennas and the RF switch component during the transmitter test mode.

6. A testing system according to claim 1, wherein the RF signal generator and analyzer is configured to send RF test signals via the array of spaced-apart probe antennas and the RE switch component to the digital antenna elements of the DUT during the receiver test mode to generate the received digital test signals to he analyzed by the at least one digital signal generator and analyzer of the digital test instrument.

7. A testing system according to claim 1, wherein the digital test instrument, RF signal generator and analyzer, and the test controller cooperate to measure a broadband channel impulse response for each digital antenna element of the DUT at different orientations to develop a 3D antenna pattern.

8. A testing system according to claim 7, wherein the digital test instrument, RE signal generator and analyzer, and the test controller further cooperate to derive calibration coefficients based upon the measured broadband channel impulse for each digital antenna element of the DUT at different orientations.

9. A testing system according to claim 8, wherein the digital test instrument, RF signal generator and analyzer, and the test controller cooperate to perform the transmitter test mode and the receiver test mode to obtain results for the broadband channel impulse response in near-field and further derive far-field results therefrom along with absolute phase information.

10. A testing system according to claim 1, wherein the programmable hardware device comprises:
    a splitter/combiner coupled to the at least one digital signal generator and analyzer;
    a calibration module configured to implement calibration coefficients for each of the digital antenna elements of the DUT in a beam test mode;
    a beam weight module configured to apply beam weights to each of the digital antenna elements of the DUT to steer a beam in a desired direction in the beam test mode; and
    a protocol module to implement the custom digital fiber interface protocol for the generated digital test signals.

11. A testing system according to claim 10, wherein the positioner is rotatable in an azimuth plane and an elevation plane within the test chamber; and wherein the test controller is configured to control rotation of the positioner during the beam test mode.

12. A testing system according to claim 11, wherein the programmable hardware device further comprises a time delay module configured to implement a different time delay for respective beams in a multi-beam test mode.

13. A testing system according to claim 1, wherein the digital fiber interface of the digital test instrument is configured to operate using Common Public Radio Interface (CPRI) specification.

14. A method of testing a device under test (DUT) having an array of digital antenna elements, the method comprising:
    positioning the DUT on a positioner in a test chamber including an array of spaced-apart probe antennas;
    sending and receiving RF test signals to from the spaced-apart probe antennas using a radio frequency (RF) signal generator and analyzer;
    selectively coupling the RF signal generator and analyzer to the array of spaced-apart probe antennas with an RF switch component;
    measuring broadband channel impulse response for each digital antenna element of the DUT using a digital test instrument including
        at least one digital signal generator and analyzer generating digital test signals to the digital antenna elements of the DUT in a transmitter test mode, and analyzing received digital test signals from the digital antenna elements of the DUT in a receiver test mode,
        a programmable hardware device implementing a custom digital fiber interface protocol for the generated and received digital test signals, and
        a digital fiber interface coupling the programmable hardware device to the array of digital antenna elements of the DUT and transceiving the digital test signals to/from the array of digital antenna elements of the DUT;
    synchronizing the RF signal generator and analyzer, and the digital test instrument, using a synchronization module; and
    controlling operation of the positioner, the RF signal generator and analyzer, the RF switch component and the digital test instrument during testing of the DUT using a test controller.

15. A method according to claim 14, wherein interior surfaces of the test chamber are covered with radiation absorbent material (RAM) to define a RF anechoic test chamber having the array of spaced-apart probe antennas and the positioner therein.

16. A method according to claim 14, wherein the positioner is rotatable within the test chamber; and wherein the test controller controls rotation of the positioner during testing of the DUT.

17. A method according to claim 14, wherein the programmable hardware device comprises:
    a splitter/combiner coupled to the at least one digital signal generator and analyzer;
    a time delay module implementing a different time delay for the digital test signals being generated from the at least one digital signal generator and analyzer to each of the digital of the antenna elements of the DUT; and
    a protocol module implementing the custom digital fiber interface protocol for the generated and delayed digital test signals.

18. A method according to claim 14, wherein the RF signal generator and analyzer captures the digital test signals transmitted by the digital antenna elements of the DUT and received via the array of spaced-apart probe antennas and the RF switch component during the transmitter test mode.

19. A method according to claim 14, wherein the RE signal generator and analyzer sends RF test signals via the array of spaced-apart probe antennas and the RF switch component to the digital antenna elements of the DUT during the receiver test mode to generate the received digital test signals for analysis by the at least one digital signal generator and analyzer of the digital test instrument.

20. A method according to claim 14, wherein the digital test instrument, RF signal generator and analyzer, and the test controller cooperate to measure the broadband channel impulse response for each digital antenna element of the DUT at different orientations to develop a 3D antenna pattern.

21. A method according to claim 20, wherein the digital test instrument, RF signal generator and analyzer, and the test controller further cooperate to derive calibration coefficients based upon the measured broadband channel impulse for each digital antenna element of the DUT at different orientations.

22. A method according to claim 20, wherein the digital test instrument, RF signal generator and analyzer, and the test controller cooperate to perform the transmitter test mode and the receiver test mode to obtain results for the broadband channel impulse response in near-field and further derive far-field results therefrom along with absolute phase information.

23. A method according to claim 14, wherein the programmable hardware device comprises:
   a splitter/combiner coupled to the at least one digital signal generator and analyzer;
   a calibration module implementing calibration coefficients for each of the digital antenna elements of the DUT in a beam test mode;
   a beam weight module applying beam weights to each of the digital antenna elements of the DUT to steer a beam in a desired direction in the beam test mode; and
   a protocol module implementing the custom digital fiber interface protocol for the generated digital test signals.

24. A method according to claim 23, wherein the positioner is rotatable in an azimuth plane and an elevation plane within the test chamber; and wherein the test controller controls rotation of the positioner during the beam test mode.

25. A method according to claim 24, wherein the programmable hardware device further comprises a time delay module implementing a different time delay for respective beams in a multi-beam test mode.

26. A method according to claim 14, wherein the digital fiber interface of the digital test instrument operates using Common Public Radio Interface (CPRI) specification.

* * * * *

UNITED STATES PATENT AND TRADEMARK OFFICE
CERTIFICATE OF CORRECTION

PATENT NO. : 10,567,984 B2  
APPLICATION NO. : 15/423440  
DATED : February 18, 2020  
INVENTOR(S) : Hong-Wei Kong et al.

Page 1 of 1

It is certified that error appears in the above-identified patent and that said Letters Patent is hereby corrected as shown below:

On the Title Page

Item (71), in Column 1, in "Applicant", Line 2, delete "Minneapolis, MN" and insert -- Santa Rosa, CA --, therefor.

In the Claims

Column 12, Line 24, in Claim 1, delete "elements:" and insert -- elements; --, therefor.

Column 12, Line 37, in Claim 1, delete "mode" and insert -- mode, --, therefor.

Column 13, Line 15, in Claim 6, delete "RE" and insert -- RF --, therefor.

Column 13, Line 17, in Claim 6, delete "he" and insert -- be --, therefor.

Column 13, Line 26, in Claim 8, delete "RE" and insert -- RF --, therefor.

Column 14, Line 1, in Claim 14, delete "to from" and insert -- to/from --, therefor.

Column 14, Line 49, in Claim 17, after "digital" delete "of the".

Column 14, Line 58, in Claim 19, delete "RE" and insert -- RF --, therefor.

Signed and Sealed this  
Twenty-sixth Day of May, 2020

Andrei Iancu  
*Director of the United States Patent and Trademark Office*